United States Patent [19]
White

[11] Patent Number: 5,448,238
[45] Date of Patent: Sep. 5, 1995

[54] METHOD AND APPARATUS FOR DIGITAL TO ANALOG CONVERSION USING GAAS HI²L PROCESS-COMPATIBLE CURRENT SWITCHING CIRCUITS

[75] Inventor: William A. White, Garland, Tex.

[73] Assignee: Texas Instruments Incorporated, Dallas, Tex.

[21] Appl. No.: 85,437

[22] Filed: Jun. 30, 1993

[51] Int. Cl.⁶ ............................................. H03M 1/66
[52] U.S. Cl. .................................. 341/134; 341/135; 341/154
[58] Field of Search ............... 341/154, 144, 153, 134, 341/150, 145, 155, 133, 135

[56] References Cited

U.S. PATENT DOCUMENTS 4,176,344  11/1979  Saari et al. ............................. 341/133
4,758,820  7/1988  Tateno .................................. 341/154 X

OTHER PUBLICATIONS

Frederick G. Weiss, "A 1 Gs/s 8-Bit GaAs DAC With On-Chip Current Sources," *IEEE GaAs IC Symposium*, 1986, pp. 217-220.

Van Andrews, et al., "A Monolithic Digital Chirp Synthesizer Chip with I and Q Channels," *IEEE Journal of Solid-State Circuits*, vol. 27, No. 10, Oct., 1992, pp. 1321-1326.

Robert W. Meyer, et al., "A Monolithic GaAs DDS for a Digital Radio Application," *Government Microcircuit Applications Conference 1992 Digest of Papers*, vol. XVIII, Nov., 1992, pp. 431-434.

*Primary Examiner*—Howard L. Williams
*Attorney, Agent, or Firm*—Michael K. Skrehot; James C. Kesterson; Richard L. Donaldson

[57] ABSTRACT

A digital to analog converter and method for conversion is provided that includes an R-2R resistor ladder network formed with a plurality of current bit switches in a GaAs HI²L integrated circuit. Each bit switch and R-2R node in the ladder network is associated with a corresponding bit position in the binary signal input to the converter. An arrangement of bipolar transistors (Q1, Q4) and diodes (D2–D3) is included in each bit switch (100) that steers current through one of two alternate paths, based on the logic state of the binary input signal (i e., "high" or "low" state). For one logic state of the binary input signal, current flows through the switch from the output of the digital to analog converter (110). For the alternate signal state, current flow from the output of the digital to analog converter is blocked. Therefore, each bit switch (100) operates as a single-pole-double-throw current mode switch under the control of the binary input signal (Ai). An arrangement of bipolar transistors (Q2, Q4) and a diode (D1) is also included to limit voltage swings and compensate for switching transients, which speeds up the recovery time of the switch and increases the overall switching speed of the digital to analog converter.

20 Claims, 3 Drawing Sheets

METHOD AND APPARATUS FOR DIGITAL TO ANALOG CONVERSION USING GAAS HI²L PROCESS-COMPATIBLE CURRENT SWITCHING CIRCUITS

CROSS-REFERENCE TO RELATED APPLICATIONS

This application is related by subject matter to commonly-assigned application Ser. No. 08/055,608, entitled "Method and Apparatus for Digital to Analog Conversion using GaAs HI²L Process-Compatible Voltage Switching Circuits", which was filed on Apr. 30, 1993.

TECHNICAL FIELD OF THE INVENTION

This invention relates generally to electronic circuits, and more particularly, to a method and apparatus for digital to analog conversion using GaAs HI²L process-compatible current switching circuits.

BACKGROUND OF THE INVENTION

In digital to analog converters ("DACs"), various types of devices including field effect transistors ("FETs"), bipolar junction transistors ("BJTs") and heterojunction bipolar transistors ("HBTs") may be configured in differential pairs as current switching or voltage switching devices. Essentially, in a current switching device, the transistor pair operating as a single-pole-double-throw switch directs current flow from one of two, alternative paths to a precision current source depending on the logic state of an incoming binary signal (i.e., "high" or "low" state). The output of a plurality of such switches is an analog signal that represents the input binary logic signal. Typically, the number of switches used in a DAC corresponds to the number of bits to be converted to an analog signal. For example, eight bit switches (transistor-pairs plus precision current sources) may be used to convert an eight bit, binary input signal to an analog output signal.

In manufacturing integrated circuit DACs, current switches may be fabricated by forming them as HBT devices in a heterojunction integrated-injection logic ("HI²L") gate structure. Since the structure of the HBT devices is compatible with the HI²L gate structure, the bipolar transistors may be readily formed on the HI²L integrated circuit chip during the fabrication process.

In an integrated circuit DAC manufacturing process, bipolar transistors configured as current switches may be formed in a Gallium Arsenide ("GaAs") HI²L gate structure. In such a structure, the switching transistors are formed with all of their emitters in common and connected to the conducting substrate. Consequently, this circuit requires one less power bus, which makes it one of the densest among the GaAs circuit technologies. However, since the switching transistors' emitters are formed in common on a single substrate, each individual emitter is inaccessible. Therefore, without access to each emitter, differential pairs cannot be constructed and accurate (i.e., reduced error) current mode switching is difficult to implement in a GaAs HI²L integrated circuit.

SUMMARY OF THE INVENTION

Accordingly, a need exists in the integrated circuit manufacturing industry for accurate digital to analog conversion using HI²L process-compatible bit switches. In accordance with the present invention, a method and apparatus is provided for accurate digital to analog conversion in which current mode switching is used in a GaAs HI²L integrated circuit. In particular, a digital to analog converter and method of conversion is provided that includes an R-2R resistor ladder network formed with a plurality of current bit switches in a GaAs HI²L integrated circuit. Each bit switch and R-2R node in the ladder network is associated with a corresponding bit position in the binary signal input to the converter. An arrangement of bipolar transistors and diodes is included in each bit switch that steers current through one of two alternate paths, based on the logic state of the binary input signal (i.e., "high" or "low" state). For one logic state of the binary input signal, current flows through the switch from the output of the digital to analog converter. For the alternate signal state, current flow from the output of the digital to analog converter is blocked. Therefore, each bit switch operates as a single-pole-double-throw current mode switch under the control of the binary input signal. An arrangement of bipolar transistors and a diode is also included to limit voltage swings and compensate for switching transients, which speeds up the recovery time of the bit switch and ultimately increases the overall switching speed of the digital to analog converter.

An important technical advantage of the present invention is that accurate switching may be accomplished in a digital to analog converter using the dense GaAs HI²L technology. The time required for the switched output current signal to recover from transients is reduced, thus increasing the overall switching speed of the device. Consequently, the present digital to analog converter is a relatively high speed device with greater resolution for higher numbers of bits, in comparison to other current or voltage bit switches.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The preferred embodiment of the present invention and its advantages are best understood by referring to FIGS. 1–7 of the drawings, like numerals being used for like and corresponding parts of the various drawings.

Figure 1:
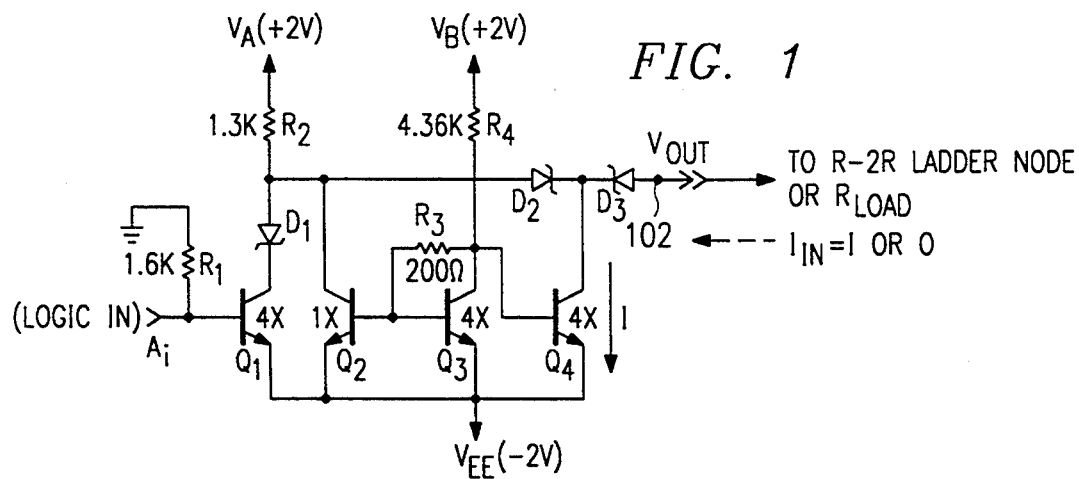
FIG. 1 illustrates an electrical schematic circuit diagram of a preferred embodiment of a single-pole-double-throw current bit switch according to the teachings of the present invention.

FIG. 1 illustrates an electrical schematic circuit diagram of a preferred embodiment of a single-pole-double-throw current bit switch according to the teachings of the present invention. As described in more detail below with respect to FIG. 3, a digital to analog converter according to the present invention may include a plurality of single-pole-double-throw current bit switches such as the switch shown in FIG. 1. For the purposes of this discussion, only the bit switch of FIG. 1 will be described in detail, since it's structure and operation is identical to that of each of the other bit switches shown in FIG. 3. Also, it should be understood that the component values shown in FIG. 1 are for illustrative purposes only and not intended as limitations to be placed on the present invention. The emitters of transistors Q1, Q2, Q3 and Q4 are common and connected to voltage supply Vee. The binary logic input signal Ai is coupled to the base of transistor Q1. One terminal of resistor R1 is connected to the base of transistor Q1, and the other terminal of resistor R1 is connected to circuit "ground". In actuality, for design purposes, circuit "ground" may be at a voltage level other than zero volts. The cathode of Schottky diode D1 is connected to the collector of Q1, and the anode of D1 is connected to one terminal of resistor R2, the collector of transistor Q2, and the anode of Schottky diode D2. The opposite terminal of resistor R2 is connected to voltage supply Va. The base of transistor Q2 is connected to one terminal of resistor R3 and the base of transistor Q3. The opposite terminal of resistor R3 is connected to the collector of transistor Q3, one terminal of resistor R4, and the base of transistor Q4. The opposite terminal of resistor R4 is connected to voltage supply Vb. The collector of transistor Q4 is connected to the cathodes of Schottky diodes D2 and D3. The anode of diode D3 is connected to node 102, which in turn, is connected to a respective node in the R-2R ladder network of the present invention, which will be described in detail below with respect to FIG. 3. Essentially, diodes D2 and D3 are used to steer current to the collector of Q4 either from the R-2R ladder node and the output of the converter (through node 102 and D3), or via an altogether different path from Va through R2 and D2. Although Schottky diodes D1–D3 are disclosed with respect to a preferred embodiment, the present invention is not intended to be so limited. Any appropriate devices that perform the functions of diodes D1–D3 may be substituted for Schottky diodes.

Figure 2:
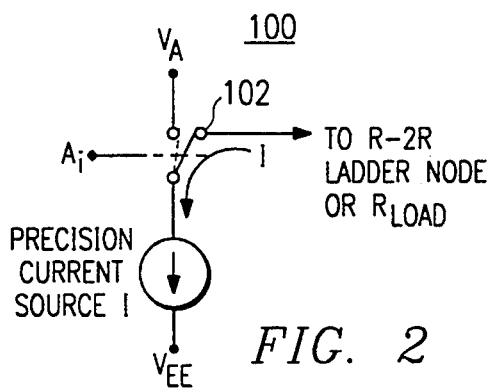
FIG. 2 illustrates an equivalent electrical circuit for the single-pole-double-throw current bit switch circuit of FIG. 1.

FIG. 2 illustrates an equivalent electrical circuit for the single-pole-double-throw current bit switch circuit of FIG. 1. As will be described in detail below, depending on the logic state (i e., "high" or "low" state) of binary input signal Ai, current switch 100 selects either a first path for current I to flow from the output of the converter through node 102 and the precision current source to Vee (input logic state "high"), or a second path that steers current I to the precision current source from Va, bypassing node 102 and the output of the converter to get to Vee (input logic state "low"). With respect to the bit switch shown in FIG. 2, a "low" input logic state provides an effective open circuit (zero current) from node 102. Consequently, it should be understood that current bit switch 100 operates effectively as a precision current source and a single-pole-double-throw switch which, under control of binary logic input signal Ai, directs the current from one of two contacts, one of which is connected to the R-2R ladder network.

Figure 3:
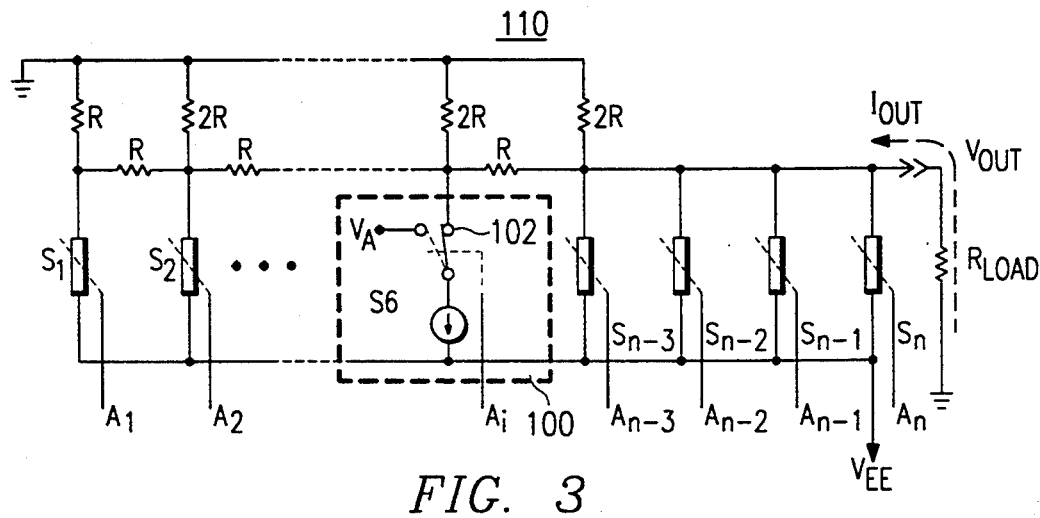
FIG. 3 illustrates an electrical schematic circuit diagram of a digital to analog converter including an R-2R ladder network and a plurality of current bit switches according to the teachings of the present invention.

FIG. 3 illustrates an electrical schematic circuit diagram of a digital to analog converter including an R-2R ladder network and a plurality of current bit switches according to the teachings of the present invention. For the purpose of this discussion, current bit switch 100 of FIG. 2 may be shown, for example, with respect to bit position 6 in a 10 bit, segmented architecture DAC. Such a segmented approach combines a 6 bit R-2R ladder DAC with a 15 bit unitary coded DAC, with the unitary DAC generating coarse output analog levels and the R-2R DAC generating the fine analog levels. For clarity, only four of the fifteen unitary switches are shown in FIG. 3. The combination of coarse and fine levels results in a total of 1024 output analog levels and 10 bit resolution, for this particular embodiment. Of course, the number of R-2R ladder legs and current bit switches may be varied to provide either higher or lower bit resolutions (e.g., 8 bit or 16 bit resolutions). Although current bit switch 100 is shown with respect to bit position 6 in the segmented network of FIG. 3, it should be understood that the structure and operation of current bit switch 100 is identical to that of each of the other bit switches shown in FIG. 3, and consequently, the description herein of bit switch 100 applies equally to each of the other bit switches shown in FIG. 3. Digital to analog converter 110 shown in FIG. 3 is based on a segmented network having an output current (Iout) in which each R-2R ladder current switch in the network provides a binary weighted contribution to the total current seen at the output, and each unitary current switch provides a unitary (equally) weighted contribution.

Figure 4:
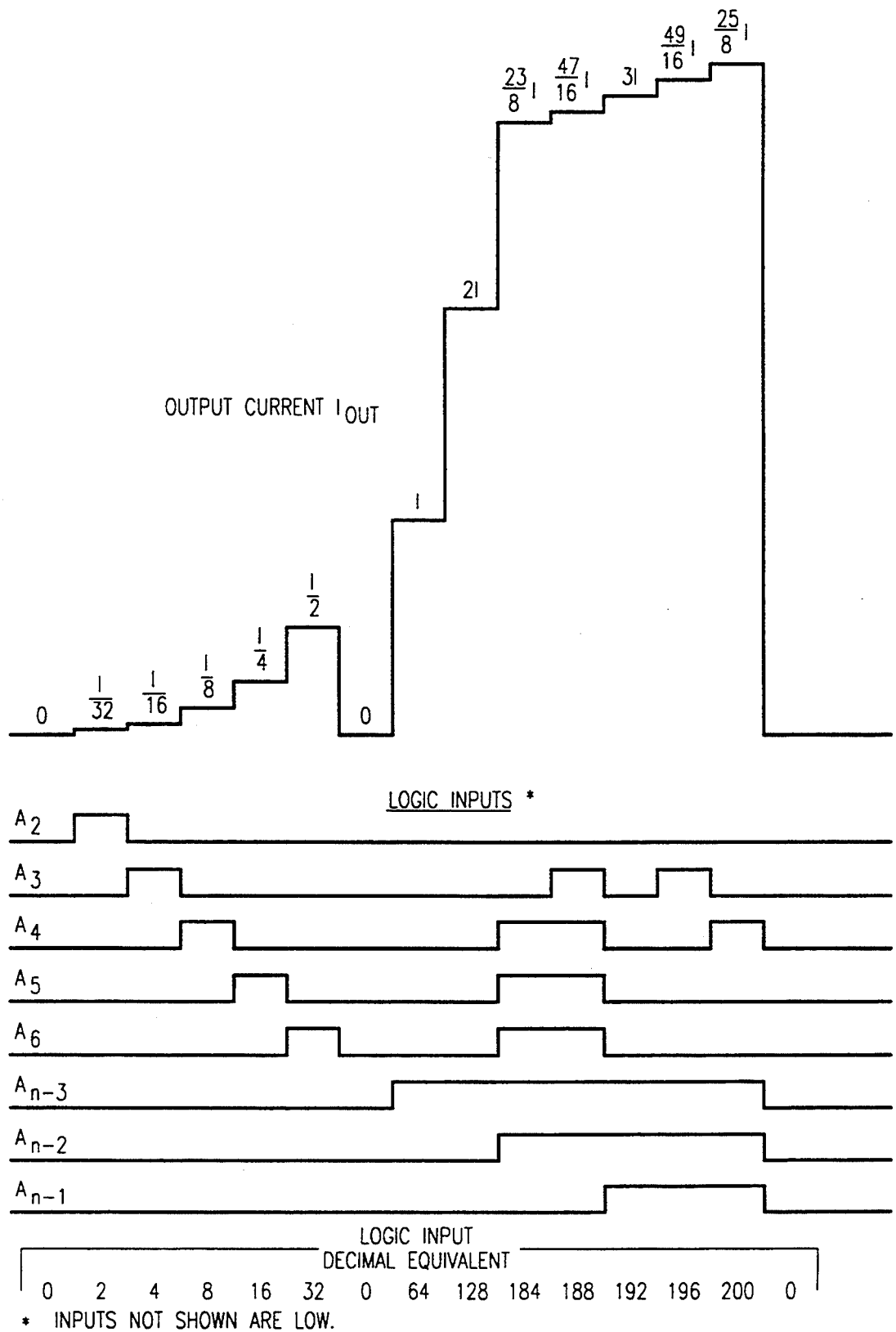
FIG. 4 illustrates a representative output waveform from the digital to analog converter shown in FIG. 3.

FIG. 4 illustrates a representative output waveform from DAC 110 shown in FIG. 3. As shown, unitary bits contribute equally weighted currents and R-2R bits contribute binary weighted currents, to the total current developed at the output (Iout) of the segmented DAC shown in FIG. 3. Consequently, according to the teachings of the present invention, the digital logic input signal Ai is converted to a corresponding analog signal (Iout) in the DAC of FIG. 3.

Figure 5:
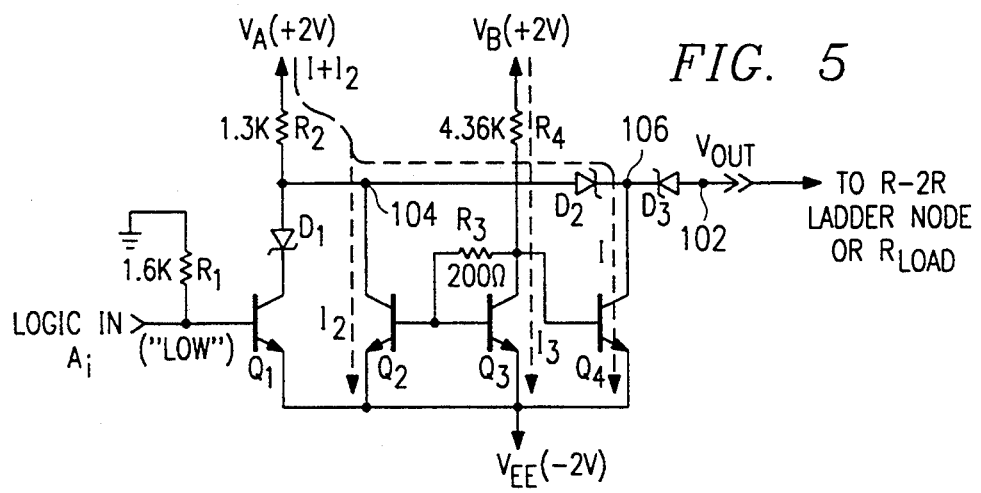
FIG. 5 illustrates current flow in the single-pole-double-throw current bit switch of FIGS. 1 and 2 for a "low" input logic signal state.

FIG. 5 illustrates current flow in the single-pole-double-throw current bit switch of FIGS. 1 and 2 for a "low" input logic signal state. The dashed line in FIG. 2 between node 102 and the "open" contact represents the alternative switch position for a "low" input logic signal state. Essentially, current steering in the present invention may be accomplished by varying the magnitude of the voltage at the anode of diode D2. For example, if the voltage at node 104 is made sufficiently positive compared to node 106, then diode D2 will be forward biased to conduct current and diode D3 will be reverse biased or very slightly forward biased and thus effectively cut off. Consequently, under such a condition, current will flow through diode D2 and not through diode D3. In effect, an open circuit will be seen between node 102 and the bit switch of FIG. 5, for a "low" input logic signal state.

Specifically, when the binary input logic signal IN is "low" transistor Q1 is cut off. For the embodiment shown in FIG. 5, the voltage at node 104 is about +0.54 v, while the voltage at node 106 is about −0.15 volts. Consequently, diode D2 would be forward biased by the voltage at node 104, and diode D3 would be reverse biased or slightly forward biased depending on the voltage Vout (node 102) which ranges from about −0.5 v to 0 v. At the largest forward bias of D3 (0.15 v), less than a nanoamp of current flows in D3, or more than three orders of magnitude less than the current in D2. So, for the full range of output voltages, D3 is effectively off, or an open circuit, for a logic "low" input signal. Therefore, all of current I would flow from Va through R2, D2 and Q4 to Vee. So, for a "low" input logic signal state, no current would flow in the bit switch from the output load through node 102, and current bit switch 100 shown in FIGS. 2 and 3 would be illustrated in the "open" contact or dashed line position.

Figure 6:
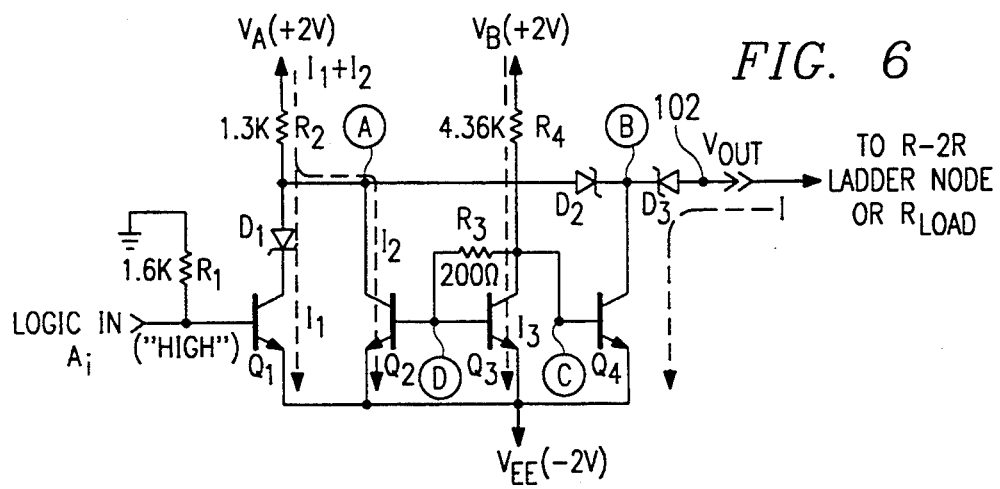
FIG. 6 illustrates current flow in the single-pole-double-throw current bit switch of FIGS. 1 and 2 for a "high" input logic signal state.

FIG. 6 illustrates current flow in the single-pole-double-throw current bit switch of FIGS. 1 and 2 for a "high" input logic signal state. The solid line in FIG. 2 between node 102 and the pole terminal which is connected to precision current source I represents the alternative switch position for a "high" input logic signal state. Essentially, if the magnitude of the voltage at node A is made sufficiently low compared to node B, then diode D2 would be reverse biased or cutoff, and diode D3 would be forward biased to conduct current I from the output load through node 102 and Q4 to Vee.

For the DAC of FIG. 3 to generate an accurate analog representation of the corresponding digital input, the output currents of each of the "on" switches (FIG. 6) must be very nearly equal and the output currents of each of the "off" switches (FIG. 5) must also be very nearly equal. Equality of the "off" currents for all bit switches, which are essentially zero, may be readily achieved in the present invention by turning off diode D3.

Referring to FIG. 6 for the "on" case, output current I is generated by transistor Q4, which along with Q3, R3 and R4 form a current mirror circuit. Although in a typical current mirror, the base of Q3 would connect directly to the collector (R3=0), the present circuit operates in a like manner except that the current in Q4 is slightly higher than the current in Q3, whereas they are equal in the typical mirror circuit (the advantageous reason for using a non-zero R3 in the present invention will be described below). As in a typical mirror circuit, current I is proportional to the ratio of bias voltage Vb for Q4 and the value of R4 (I~Vb/R4). Also as in a typical mirror circuit, the I of a circuit in one bit switch will be equal to the I of the same circuit in another switch (both circuits fabricated using the same process, of course) provided bias voltage Vb and the values of resistor R4 are the same in both switches. Thus, equality of the "on" currents may also be achieved by the present invention.

Figure 7:
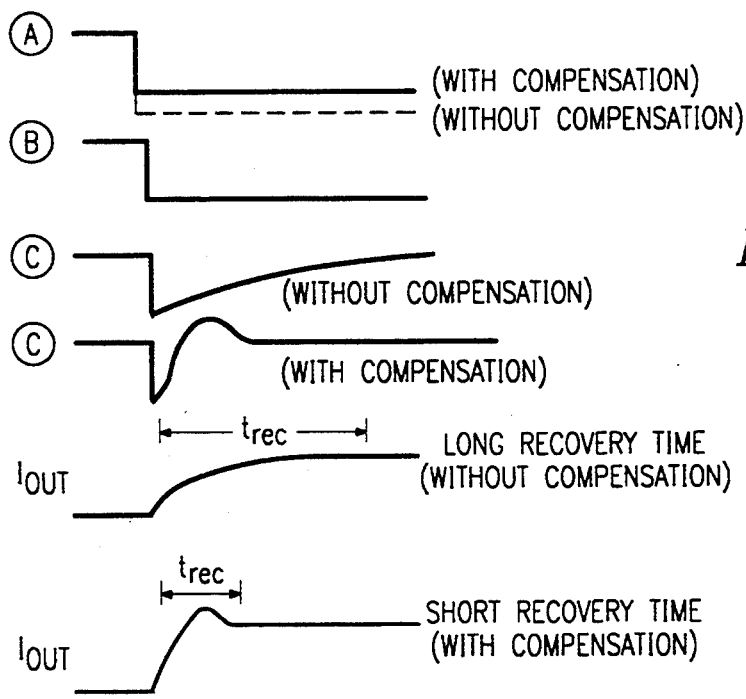
FIG. 7 illustrates signal waveforms in the single-pole-double-throw current bit switch shown in FIG. 6.

FIG. 7 illustrates signal waveforms in the single-pole-double-throw current bit switch shown in FIG. 6. Referring now to FIGS. 6 and 7, when the binary input logic signal IN is "high", transistor Q1 would conduct and current I would flow from supply Va through resistor R2, diode D1 and transistor Q1 to Vee. Diode D1 is placed in series between resistor R2 and transistor Q1. For this embodiment, diode D1's performance characteristics are selected to limit the voltage at node A to about −1.2 v, or about 0.8 v above Vee (−2.0 v). By thus limiting the voltage at node A with diode D1, when transistor Q1 is turned on, the negative voltage swing at node A would be limited thereby reducing the time needed for the signal to reach the lower level (−1.2 v) following a low-to-high transition of the logic signal IN. Also, the value of resistor R2 is selected to limit the positive voltage swing at node A, which reduces the time needed for the voltage at node A to swing in the opposite direction (following a high-to-low transition of logic signal IN). The current through resistor R2 is provided by transistors Q1 and Q2 for a "high" input logic signal state. For proper operation, the voltage at node A must be sufficiently negative to insure effective cutoff of diode D2 for the full range of expected output voltage, Vout. As previously described, these diodes are still effectively off even for slight forward bias. Therefore, if node B is 0.1 v less than node A, diode D2 is still cut off. Thus node B, which is one diode drop below the output voltage (D3 is on) may be as low as −1.3 v. Then for a diode drop of about 0.7 v, Vout may be as low as −0.6 v and D2 will still be off. Since the expected output range is only 0 v to about −0.5 v, the requirement that D2 be off over the full output voltage range for a high logic input state is met. Thus, current flow would be directed from the output load through diode D3. Therefore, current I would flow in a path through diode D3 and transistor Q4 to Vee. In other words, current bit switch 100 shown in FIGS. 2 and 3 would be represented in the "closed" contact or solid line position.

As described above, diode D1 in series between resistor R2 and transistor Q1 limits the negative going swing at node A, whereas the positive going swing is limited by the drop across R2 due to the collector currents of Q2 and Q4. The limited swing reduces the time required to switch current I from, or away from, the bit switch output and thus improves the overall recovery time of the bit switch. Also, when switching the current bit switch "on", the rapidly negative changing voltage at node B would be coupled through the base-collector capacitance of transistor Q4 to node C. Without compensating for this condition, the voltage at node C would be more negative than desired, which would cause reduced current flow through transistor Q4. This transient in the output current I would decay exponentially as node C would charge back to a desired value. Transistor Q2 and resistor R3 have been added to compensate for this transient in the output current and speed up the recovery time of the bit switch. For example when switching the bit switch "on" the rapid negative transition of the voltage at node A is now coupled through the base-collector capacitance of transistor Q2 to node D. The resulting negative transition of the signal at node D momentarily reduces current flow through transistor Q3, which in turn, makes more current available to charge node C and shorten the recovery time of the signal at node C. Consequently, the time required for the output current through node 102 to recover from the "turn on" transient is reduced significantly, which significantly increases the speed of the bit switch and the overall switching speed of the digital to analog converter. Although a capacitor could be used to couple a compensating signal from node A to node D, it is advantageous to use the base-collector capacitance of a transistor (Q2) as described. Since Q2 is fabricated in the same manner as Q4, process variations affect both devices equally. So if, for example, the base-collector capacitance of Q4 decreases and less compensation is needed, the base-collector capacitance of Q2 also decreases and less compensating signal is coupled to node D. In contrast, a fixed capacitor would couple the same signal to node D and the circuit would be over-compensated and take longer to recover.

Although the present invention and its advantages have been described in detail, it should be understood that various changes, substitutions and alterations can be made herein without departing from the spirit and scope of the invention as defined by the appended claims.

What is claimed is:

1. A switch circuit, comprising:
   an input terminal;
   an output terminal;
   a voltage generating circuit connected to said input terminal, said voltage generating circuit operable to produce a relatively high or low voltage at a first node in response to a high or low voltage at said input terminal;
   an output current switching circuit connected to said first node, said output current switching circuit operable to produce an output current or a null output current at said output terminal in response to said relatively high or low voltage at said first node;
   a compensating circuit coupled to said first node and said output current switching circuit, said compensating circuit operable to compensate for fluctuations in said output current.

2. The circuit of claim 1, further comprising a limiting circuit coupled between said input terminal and said first node, said limiting circuit operable to limit positive and negative voltage swings at said first node to predetermined values.

3. The circuit of claim 2, wherein said limiting circuit comprises a diode coupled between said first node and a transistor, said transistor coupled to said input terminal.

4. The circuit of claim 1, wherein said voltage generating circuit comprises a transistor coupled between said input terminal and said first node, wherein applying a signal to a control terminal of said first transistor determines the voltage at said first node.

5. The circuit of claim 1, wherein said output current switching circuit comprises:
   a first diode coupled between said first node and a second node;
   a second diode coupled between said second node and said output terminal; and
   a transistor coupled between said second node and a power supply.

6. The circuit of claim 1, wherein said compensating circuit comprises:
   a capacitive element coupled to said first node; and
   a transistor coupled between said capacitive element and said output current switching circuit.

7. The circuit of claim 6, wherein said capacitive element is the junction capacitance of a transistor.

8. A digital-to-analog converter formed in an integrated circuit, including:
   a) a plurality of switches, each of said switches comprising:
      i) an input terminal;
      ii) an output terminal;
      iii) a voltage generating circuit connected to said input terminal, said voltage generating circuit operable to produce a relatively high or low voltage at a first node in response to a high or low voltage at said input terminal;
      iv) an output current switching circuit connected to said first node, said output current switching circuit operable to produce an output current or a null output current at said output terminal in response to said relatively high or low voltage at said first node;
      v) a compensating circuit coupled to said first node and said output current switching circuit, said compensating circuit operable to compensate for fluctuations in said output current;
   b) a multiple-segment resistive ladder network coupled between said output terminals of said plurality Of switches and a reference potential;
   c) a converter output terminal coupled to said multiple-segment resistive ladder network and said output terminals of said plurality of switches.

9. The digital-to-analog converter of claim 8, wherein said integrated circuit is a gallium arsenide integrated circuit.

10. The digital-to-analog converter of claim 8, wherein each of said plurality of switches comprises a limiting circuit coupled between said input terminal and said first node, said limiting circuit operable to limit positives and negative voltage swings at said first node to predetermined values.

11. The digital-to-analog converter of claim 10, wherein said limiting circuit comprises a diode coupled between said first node and a transistor, said transistor coupled to said input terminal.

12. The digital-to-analog converter of claim 11, wherein said transistor is a heterojunction bipolar transistor.

13. The digital-to-analog converter of claim 8, wherein said voltage generating circuit comprises a transistor coupled between said input terminal and said first node, wherein applying a signal to a control terminal of said first transistor determines the voltage at said first node.

14. The digital-to-analog converter of claim 13, wherein said transistor is a heterojunction bioplar transistor.

15. The digital-to-analog converter of claim 8, wherein said output current switching circuit comprises:
   a first diode coupled between said first node and a second node;
   a second diode coupled between said second node and said output terminal; and
   a transistor coupled between said second node and a power supply.

16. The digital-to-analog converter of claim 15, wherein said transistor is a heterojunction bioplar transistor.

17. The digital-to-analog converter of claim 8, wherein said compensating circuit comprises:
   a capacitive element coupled to said first node; and
   a transistor coupled between said capacitive element and said output current switching circuit.

18. The digital-to-analog converter of claim 17, wherein said capacitive element is the junction capacitance of a transistor.

19. The digital-to-analog converter of claim 18, wherein said transistor is a heterojunction bipolar transistor.

20. The digital-to-analog converter of claim 17, wherein said transistor is a heterojunction bipolar transistor.